United States Patent
Makover et al.

(10) Patent No.: US 9,502,897 B2
(45) Date of Patent: Nov. 22, 2016

(54) SYSTEMS AND METHODS FOR PHOTOVOLTAIC MICRO-INVERTER POWER HARVESTING EFFICIENCY INCREASE IN SHADED CONDITIONS

(75) Inventors: Amir Makover, Ceaseria (IL); Arie Dolev, Holon (IL)

(73) Assignee: SolarBread LTD, Ceaseria, IL (US)

( * ) Notice: Subject to any disclaimer, the term of this patent is extended or adjusted under 35 U.S.C. 154(b) by 131 days.

(21) Appl. No.: 13/982,264

(22) PCT Filed: Oct. 4, 2011

(86) PCT No.: PCT/IL2011/000777
§ 371 (c)(1),
(2), (4) Date: Oct. 4, 2013

(87) PCT Pub. No.: WO2012/107919
PCT Pub. Date: Aug. 16, 2012

(65) Prior Publication Data
US 2014/0028104 A1    Jan. 30, 2014

Related U.S. Application Data

(60) Provisional application No. 61/442,183, filed on Feb. 12, 2011.

(51) Int. Cl.
*H02J 3/00* (2006.01)
*H01L 31/02* (2006.01)
*H02J 3/38* (2006.01)

(52) U.S. Cl.
CPC ........... *H02J 3/00* (2013.01); *H01L 31/02021* (2013.01); *H02J 3/383* (2013.01); *H02J 3/385* (2013.01); *Y02E 10/563* (2013.01); *Y02E 10/58* (2013.01); *Y10T 29/49117* (2015.01); *Y10T 307/50* (2015.04); *Y10T 307/707* (2015.04)

(58) Field of Classification Search
None
See application file for complete search history.

(56) References Cited

U.S. PATENT DOCUMENTS

| | | | |
|---|---|---|---|
| 4,166,918 A * | 9/1979 | Nostrand | H01L 31/208 136/243 |
| 4,409,537 A | 10/1983 | Harris | |
| 4,456,782 A * | 6/1984 | Nishiura | H01L 31/02021 136/244 |
| 4,591,965 A | 5/1986 | Dickerson | |
| 4,636,931 A | 1/1987 | Takahashi | |
| 4,868,379 A | 9/1989 | West | |
| 5,677,833 A | 10/1997 | Bingley | |
| 6,278,052 B1 | 8/2001 | Takehara | |
| 6,278,054 B1 | 8/2001 | Ho | |
| 6,365,825 B1 * | 4/2002 | Hayashi | H01L 31/186 136/243 |
| 6,838,611 B2 | 1/2005 | Kondo | |
| 7,126,053 B2 | 10/2006 | Kurokami | |

(Continued)

OTHER PUBLICATIONS

Hermann, Wiesner, et al. Hot Spot Investigations on PV Modules—New Concepts for a Test Standard and Consequences for Module Design with respect to Bypass Diodes.

(Continued)

*Primary Examiner* — Charlie Y Peng
(74) *Attorney, Agent, or Firm* — Steven C. Lessoff

(57) ABSTRACT

A method and system are disclosed for producing electricity from solar radiation using a solar panel that efficiently produces electricity and is protected against cell burnout in partial shaded conditions. Short length substrings are independently connected to corresponding collector circuits to provide electricity at less than the burnout threshold of a shaded cell. Direct current power from each substring is independently optimized, collected and may be inverted to alternating current.

26 Claims, 15 Drawing Sheets

(56) References Cited

U.S. PATENT DOCUMENTS

| | | | |
|---|---|---|---|
| 7,900,361 B2 | 3/2011 | Adest | |
| 8,013,472 B2 | 9/2011 | Adest | |
| 2004/0089337 A1* | 5/2004 | Chou | 136/244 |
| 2007/0181175 A1* | 8/2007 | Landis | 136/252 |
| 2007/0286324 A1* | 12/2007 | Hagelstein | G21B 3/00 376/320 |
| 2008/0238195 A1 | 10/2008 | Shaver | |
| 2009/0020151 A1 | 1/2009 | Fornage | |
| 2009/0032085 A1 | 2/2009 | Grumazescu | |
| 2010/0089431 A1* | 4/2010 | Weir | G05F 1/67 136/244 |
| 2010/0106438 A1 | 4/2010 | Fornage | |
| 2010/0132759 A1* | 6/2010 | Jia | H01L 31/0463 136/244 |
| 2010/0217724 A1 | 8/2010 | Wayne | |
| 2010/0218805 A1* | 9/2010 | Everett et al. | 136/246 |
| 2011/0012429 A1 | 1/2011 | Fornage | |
| 2011/0025130 A1* | 2/2011 | Hadar et al. | 307/80 |
| 2011/0115297 A1 | 5/2011 | de Waal et al. | |
| 2011/0221195 A1* | 9/2011 | Raju | H02M 7/49 290/44 |
| 2012/0024337 A1* | 2/2012 | Bellacicco | H02S 40/36 136/244 |
| 2012/0086283 A1* | 4/2012 | Yamamoto et al. | 307/104 |
| 2012/0090675 A1* | 4/2012 | Shim | H01L 31/02168 136/255 |
| 2012/0098344 A1 | 4/2012 | Bergveld | |
| 2012/0193990 A1 | 8/2012 | Nimni | |
| 2012/0280567 A1* | 11/2012 | Buller | H02J 1/06 307/43 |

OTHER PUBLICATIONS

Photovoltaic Specialists Conference 1997., Conference Record of the Twenty-Sixth IEEE. 1997, vol. 29, pp. 1129-1132, USA.

Herrmann, W, et al. Operational Behaviour of Commercial Solar Cells Under Reverse Biased Conditions. Tüv Rheinland Sicherheit Und Umweltschutz Gmbh Am Grauen Stein. 2000.

Australian Standard Grid connection of energy systems via inverters Part 3: Grid protection requirements, Standards Australia GPO, 2001, Sidney Austrialia.

Achim Woyte et al. Partial Shadowing of Photovoltaic Arrays with Different Systems Configurations: Literature Review and Fleld Test Results, Solar Energy 73(3) p. 217-233, 2003.

Australian Standard Grid connection of energy systems via inverters Part 2: inverter requirements, Standards Australia GPO, 2001, Sidney Austrialia.

Chaisook, Single-phase grid-connected photovoltaic system using rectified sinusoidl hysteresis current control, Masters Thesis, King Mongkut's University, Thonburi 2002.

Walker, et al. PV String Per-Module Maximum Power Point Enabling Converters, AUPEC 2003 New Zealand.

\* cited by examiner

SYSTEMS AND METHODS FOR PHOTOVOLTAIC MICRO-INVERTER POWER HARVESTING EFFICIENCY INCREASE IN SHADED CONDITIONS

CROSS REFERENCE TO RELATED APPLICATIONS

This patent application claims foreign priority benefits under 35 USC 119 of PCT patent application. Ser. No. WO2011IL00777 filed 4 Oct. 2011 which in turn claims priority of U.S. Provisional Patent Application No. 61/442,183 filed 12 Feb. 2011.

TECHNICAL FIELD

Various methods and systems are possible to increase generation of power from sunlight using a photovoltaic (PV) panel. More particularly, various methods may be applied to increase power harvesting from a PV panel in dynamic irradiance conditions and shade.

BACKGROUND ART

Conventional Solar Panels

Photovoltaic (PV) cells produce direct current (DC). DC output of PV cells is generally inverted to alternating current (AC). In conventional PV power generation, the DC outputs from a few PV modules (each module or panel producing 24-50V DC potential) are generally connected in series (string) to feed a centralized inverter.

More recently micro-inverters have been used in place of central inverters. A micro-inverter converts the output of a single PV panel to AC. The AC output of multiple micro-inverters may be combined.

Generally, a PV panel is constructed of substrings. Each substring is composed of ten to twenty solar cells in series, and each cell operates at approximately 0.6V. A PV panel generally includes between two to five substrings yielding a panel output of 24V to 60V DC.

Partially Shaded Substrings and Reverse Bias

When a PV panel is partially irradiated such that a few cells are shaded and many cells are fully irradiated, the irradiated cells force the shaded cells to operate in reverse bias mode. In reverse bias, instead of generating electrical energy, a shaded cell dissipates excess power as heat. Heating may lead to a local short-circuit and permanent damage in the cell. In popular crystalline PV modules a bypass diode is used across each substring to prevent such reverse biasing.

FIG. 1 shows a panel with three substrings 14a, 14b, and 14c each having fourteen cells (shown as small square solar batteries). One cell of substring 14c is blocked by shade 16. Each substring 14a-c has a bypass diode 12a, 12b, and 12c respectively. Flow of electricity is shown by dotted arrows. Electricity flows through substrings 14a and 14b but because substring 14c is partially shaded, the voltage potential is small and electricity bypasses substring 14c and passes through bypass diode 12c.

FIG. 2 shows a current voltage curve, IV-characteristic 21a, of a fully irradiated solar cell in its normal forward operating mode and power 23a generated by the cell at the maximum power point (MPP) 25. Also shown is the IV-characteristic 21b of a shaded cell in forward operating mode.

Because all of the substrings of the PV panel are connected in series, all cells are forced to operate at the same current (substring current). It can be seen that the current 22a produced by the sunlit cell at its MPP is greater than the maximum current 22b produced by the shaded cell. Therefore when a shaded cell is connected in series with a sunlit cell working at high current, the shaded cell becomes reverse biased and begins to dissipate power by heating up.

Cell Breakdown (Burn Out)

FIG. 3 shows a typical IV-characteristic 21d of a shaded solar cell as in FIG. 2 and also illustrates the reveres bias mode (for reverse or negative current). Whereas the forward characteristic extends to the open circuit voltage of approximately 0.6 Volts, reverse biased IV-characteristic 21d is much more extensive and limited by the breakdown voltage threshold 37. This means that one shaded cell may dissipate very large amounts of power 23c, thereby absorbing the power produced by a few irradiated cells.

At low reversed bias voltages the power dissipation is distributed over the whole shaded cell area and heating takes place uniformly. The cell is designed so when the current density is below a critical limit, the cell is stable against thermal effects. With rising reverse bias current a junction breaks down and conducts very large currents. Cells do not have a homogeneous structure, and contain regions with a higher concentration of impurities. At high reverse bias currents these regions break down earlier. If the current density in a high impurity region exceeds a critical limit, the cell is irreversibly damaged by thermal breakdown that forms a shunt path in the cell structure. When a long series of fully irradiated cells is connected in series with a shaded cell, the irradiated cells can produce enough power to burn out the shaded cell.

The process of cell short circuiting is described in HERMANN, Wiesner, et al. Hot Spot Investigations on PV Modules—New Concepts for a Test Standard and Consequences for Module Design with respect to Bypass Diodes. *Photovoltaic Specialists Conference* 1997, *Conference Record of the Twenty-Sixth IEEE* 1997, vol. 29, p. 1129-1132, and also in HERRMANN, W, et al. Operational Behaviour of Commercial Solar Cells Under Reverse Biased Conditions. *TÜV RHEINLAND SICHERHEIT UND UMWELTSCHUTZ GMBH AM GRAUEN STEIN.* 2000.

FIG. 4 illustrates use of a by-pass diode to prevent reverse bias breakdown in a prior art solar panel having three substrings of eighteen cells each connected in series. A bypass diode is used across each substring. When reverse biasing reduces the voltage of a partially shaded substring beyond a danger threshold the diode short circuits the substring. This short circuiting prevents reverse bias that may harm shaded cells in the substring, but leaves the partially shaded substring working at the danger threshold at which no power is generated.

Power Generated by a Partially Shaded Panel

In FIG. 4 the horizontal axis is voltage and the vertical axes of the upper graph is current for IV-characteristics 421a, 421b and 421c; where IV-characteristic 421a is for a panel having one partially shaded substring with a bypass diode, and IV-characteristic 421b is for a panel having one partially shaded substring without a bypass diode and IV characteristic 421c is for a fully irradiated panel. Under full sun and below the MPP voltage, the panel acts as a constant current source with IV-characteristic 421c and maximal power 425c output of about seventy watts at 2.7 amps current.

The lower graph shows power output curves 423a, 423b and 423c voltage vs. power output (watts). Power output curve 423a shows the power output of the panel with one shaded cell with bypass diodes, power output curve 423b shows the power output of a panel with one shaded cell without bypass diodes, and power output curve 423c shows the power output of a fully irradiated panel. It can be seen that the bypass diodes protect the shaded cell from reverse breakdown, but do not significantly help the power output. The activation of the diode in its conductive mode adds a new global peak power 425a of 45 W to the overall partially shaded panel IV-characteristic 423a. The maximum power 425b 38 W of a partially shaded panel without bypass diodes (panel IV-characteristic 423b) is only a local maximum for a panel with bypass diodes (IV-characteristic 423a).

The reduction in power harvesting from a PV panel in serial connection is not insignificant in shading and dynamic irradiation condition and can contribute to a loss of 30% from the potentially available power, for a 5% shaded PV panel. In a situation where the shade is distributed between two substrings the loss of power can amount to 60%. More particularly, at high current the partially shaded panel produces little power because the shaded cell dissipates a lot of power at high current. At low current the partially shaded panel produces little power because the irradiated strings are working far from their MPP.

Some Attempted Solutions

US published patent application US 20090020151 A (FORNAGE) 22 Jan. 2009 (Formage '151) discloses a method to optimize power output from a solar panel by connecting multiple nano-inverters to the panel (for example one nano-inverter for each row of cells). In this way each nano-inverter may be connected to all sunlit cells or to all shaded cells avoiding the problem of partially illuminated substrings. In this way Formage '151 extracts power from substrings that are in the shade along with fully lit substrings. Nevertheless, the method of Formage '151 does not offer a solution to a partially shaded substring. Because the angle of the sun changes both east to west (over the course of a day) and north to south (over the course of a year) it is may not be practical to find a geometry which will never have partially shaded substrings.

US published patent application US 20100106438 (FORNAGE) 29 Apr. 2010 (Formage '438) discloses a controller programmed to compute the MPP and the voltage lower bound for PV cell reverse bias breakdown. The operating voltage is then chosen to be greater than the lower bound and as close as possible to the MPP. The methodology of Formage '438 has a few drawbacks. Firstly, the controller of Formage '438 needs to be much more complex than a standard controller in order to compute both the MPP and the lower bound voltage. Furthermore, the lower bound voltage is a complicated function of temperature, the kind of cells, the quality of the materials used in the cells and the quantity of cells in the panel. This leads to a more complex and expensive solar panel and a less flexible system.

Thus, there is a recognized need and it would be desirable to develop a solar panel which is not vulnerable to reverse bias burn out, extracts global maximum power from partially shaded substrings and is simple to build, operate and repair.

Application to Solar Fields

One problem when designing large solar fields is the transfer of energy from a large array of solar panels to a single collection circuit. Conventional DC series connections require long cables connecting large numbers of panels over a large area. With a central Inverter, the wiring must be carefully balanced in order that the MPP determined by the centralized controller will be correctly and equally distributed to all of the panels. This requires heavy high current DC connections across the field. The complexities of balancing input to the collecting circuit and the cost of cables and their specialized installation and upkeep can be a significant problem. This problem is exacerbated as the field ages because aging affects different components differently and power output from different sets of panels that was originally balanced becomes unbalanced over time causing problems in combining the power and eventually power losses. The delicate balance of various components can also be thrown off by partial shading due to dust and clouds.

Two other technical limitation result from the need to prevent partial shading in large solar installations. Firstly, the distance between rows of panels is kept large. Commonly the distance between rows is equal to the row width (distance 1480a equals distance 1480b in FIG. 14a). Otherwise at times of low angle 1486 solar radiation 1482a (the morning or afternoon) one row 1484a will partially shaded the next row 1484b. Secondly, wiring is installed underground because overhead wiring could cause shading on a few percent of a panel's surface and throw off the MPP or cause activation of burn out protection diodes of the entire installation causing a few tens of percent loss of power.

SUMMARY

Various methods and systems to convert solar energy to electricity are possible.

An embodiment of a system for generating electricity from sunlight may include a plurality of substrings of photovoltaic cells. Each substring of may have a length smaller than a minimal length necessary to produces a break down threshold output under terrestrial solar radiation. The system may also include a plurality of independent collector circuits. A first independent collector circuit may be configured to collect power output from a first substring and a second independent collector circuit may be configured to collect power output from a second substring.

In an embodiment of a system for generating electricity from sunlight, the first independent collector circuit may include an inverter for inverting a direct current output from the first substring into an alternating current.

In an embodiment of a system for generating electricity from sunlight, each independent collector circuit may includes an inverter for inverting a direct current output from a corresponding substring into an alternating current.

In an embodiment of a system for generating electricity from sunlight, respective outputs may be balanced dynamically using pulse wave modulation.

In an embodiment of a system for generating electricity from sunlight, respective outputs may be combined using standard electrical connectors.

In an embodiment of a system for generating electricity from sunlight, the first independent collector circuit and the second independent collector circuit may be operationally connected to a first combiner circuit.

In an embodiment of a system for generating electricity from sunlight, the first combiner circuit may include a plurality of primary windings and a single secondary winding.

An embodiment of a system for generating electricity from sunlight may also include a second combiner circuit and a trunk line. The trunk line may be configured for joining an output of the first combiner circuit with an output of the second combiner circuit.

In an embodiment of a system for generating electricity from sunlight, the first combiner circuit may include a DC maximizer.

In an embodiment of a system for generating electricity from sunlight, the first substring may not include a bypass diode.

An embodiment of a system for generating electricity from sunlight may also include a controller configured for computing a first maximum power point for the first substring and the controller may also be configured for computing a second maximum power point for the second substring. The first and second maximum power points may be independent.

An embodiment of a method for manufacturing a solar power generation system may include supplying a plurality of substrings of solar cells. Each substring may have a maximal length. The method may also include establishing the maximal length to limit a maximal output of each substring under terrestrial solar radiation to less than a break down threshold. The method may also include operationally connecting a first substring to a first independent collector circuit.

An embodiment of a method for manufacturing a solar power generation system may further include operationally connecting a second substring to a second independent collector circuit.

An embodiment of a method for manufacturing a solar power generation system may further include combining an output channel of the first independent collector circuit and an output channel of the second independent collector circuit to a first combiner circuit.

An embodiment of a method for manufacturing a solar power generation system may further include joining an output channel of the first combiner circuit with an output channel of a second combiner circuit.

In an embodiment of a method for manufacturing a solar power generation system, the joining of output channel of the first independent collector circuit with the output channel of the second independent collector circuit may include operationally connecting the first independent collector circuit to a first primary winding of a combiner transformer and operationally connecting the second independent collector circuit to a second primary winding of the combiner transformer.

An embodiment of a method for manufacturing a solar power generation system may further include supplying an inverter for converting a direct current output of the first substring into an alternating current.

An embodiment of a method for solar power generation may include supplying a plurality of substrings. Each substring of may have a maximal output under terrestrial solar radiation of less than a break down threshold. Power output from a first substring may be collected with a first independent collector circuit.

In an embodiment of a method for solar power generation, collecting power from the substrings may include converting a direct current power output of the first substring into an alternating current.

An embodiment of a method for solar power generation may further include computing a maximum power point for the first substring.

An embodiment of a method for solar power generation may further include computing a maximum power point for a second substring.

An embodiment of a method for solar power generation may further include collecting power output from a second substring with a second independent collector circuit.

An embodiment of a method for solar power generation may further include combining an output of the first independent collector circuit with an output of the second independent collector circuit using a first combiner circuit.

An embodiment of a method for solar power generation may further include joining an output of the first combiner circuit with an output of a second combiner circuit.

In an embodiment of a method for solar power generation collecting may further include inverting a direct current output of the first substring into an alternating current signal.

In an embodiment of a method for solar power generation collecting may further include balancing an output of the first combiner circuit and an output of a second combiner circuit by pulse width modulation.

BRIEF DESCRIPTION OF THE DRAWINGS

Various embodiments of a system and method for harvesting solar energy are herein described, by way of example only, with reference to the accompanying drawings, where.

DETAILED DESCRIPTION OF DRAWINGS

The principles and operation of a solar panel system for efficiently converting solar energy to electrical power under partially shaded conditions according to various embodiments may be better understood with reference to the drawings and the accompanying description.

Overview

Figure 5:
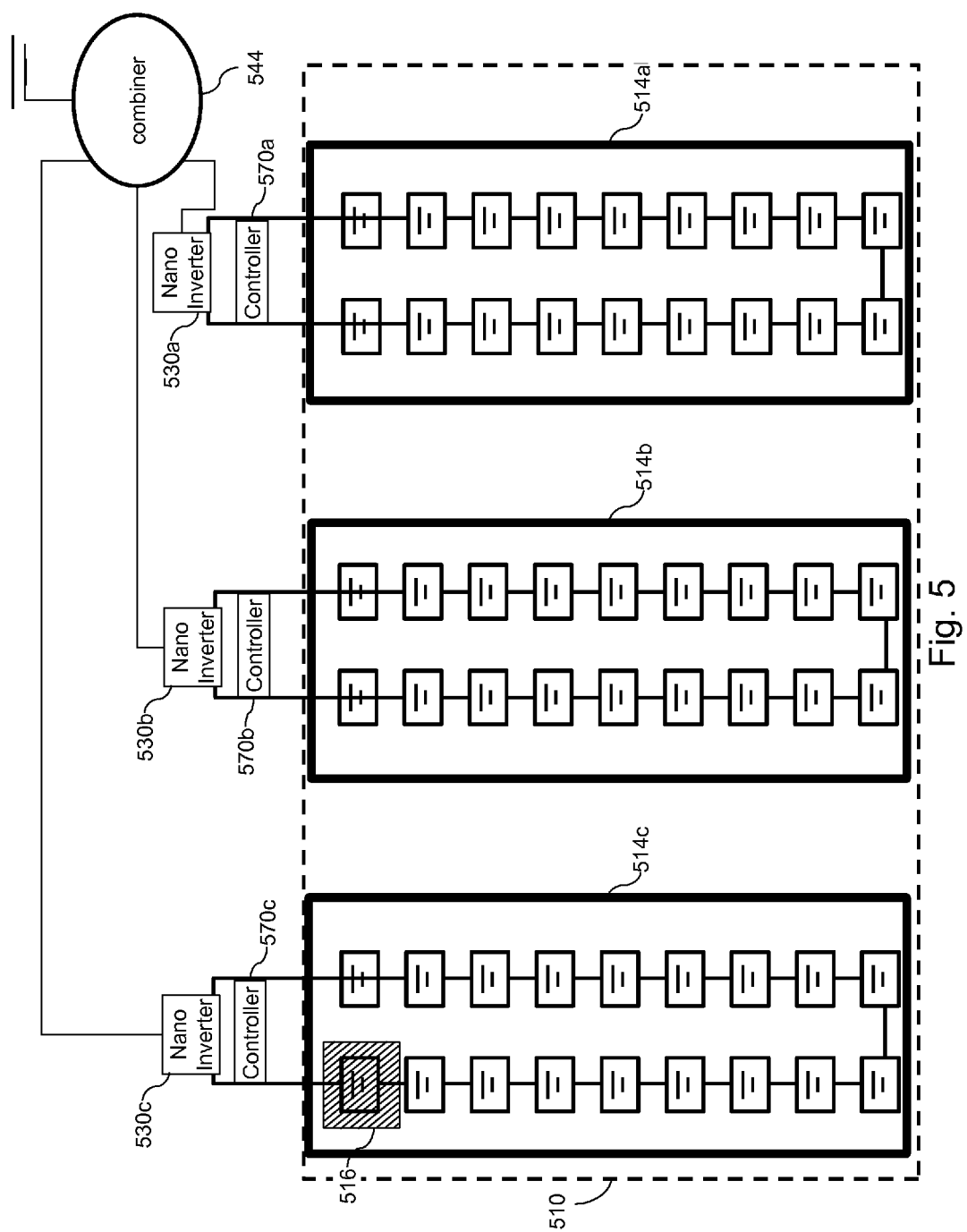
FIG. 5 is a high level box illustration of an embodiment of a solar panel system having independent short substrings and power collectors without bypass diodes.

FIG. 5 is a simplified illustration of a first embodiment of a solar power collector panel 510. Panel 510 includes three substrings 514a, 514b and 514c. Each substring includes eighteen cells and is independently connected to a collector circuit, for example nano-inverters 530a, 530b, and 530c. Substring 514c includes a single shaded cell 516. Each substring is controlled by a corresponding MPP controller 570a, 570b and 570c. Nano-inverters 530a-c convert the DC output of each substring into AC power which is combined in a combiner transformer 544. The combined power may be converted to a 50 Hz signal (as explained herein below) sold to an electric power company, or used to power a device or stored.

To reach burn out requires enough power to overcome the reverse bias voltage. In the embodiment each substring 514a-c is short and each substring 514a-c is independent (not in series with other substrings). The length of substrings is chosen so that the irradiated cells in an isolated substring will not be able to produce enough power to force a shaded cell into reverse bias break down. Depending on the PV cells the substring length may be limited to less than fifteen cells or less than eighteen cells.

In panel 510 each substring functions independently at its optimum MPP. Thus, the two fully irradiated substrings 514a-b can function at the maximum MPP (each substring having eighteen cells each producing 0.6V at MPP of 2.7 Amps) producing 2 substrings×18 cells/substring×0.6 Volt/cell×2.7 Amps=58 Watts. Plus the partially shaded substring with one shaded cell produces 17 cells/substring×0.6 Volt/cell×1 Amp=9 Watts. Thus the total panel power output of panel 510 is approximately 58+9=67 Watts under the same partially shaded conditions under which the conventional panel produces only 45 watts as described above.

Panel 510 is protected from reverse bias burn out because the length of each substring is smaller than the minimal length necessary to produce enough power (the threshold power) under terrestrial solar irradiation to burn out a shaded cell.

Figure 1:
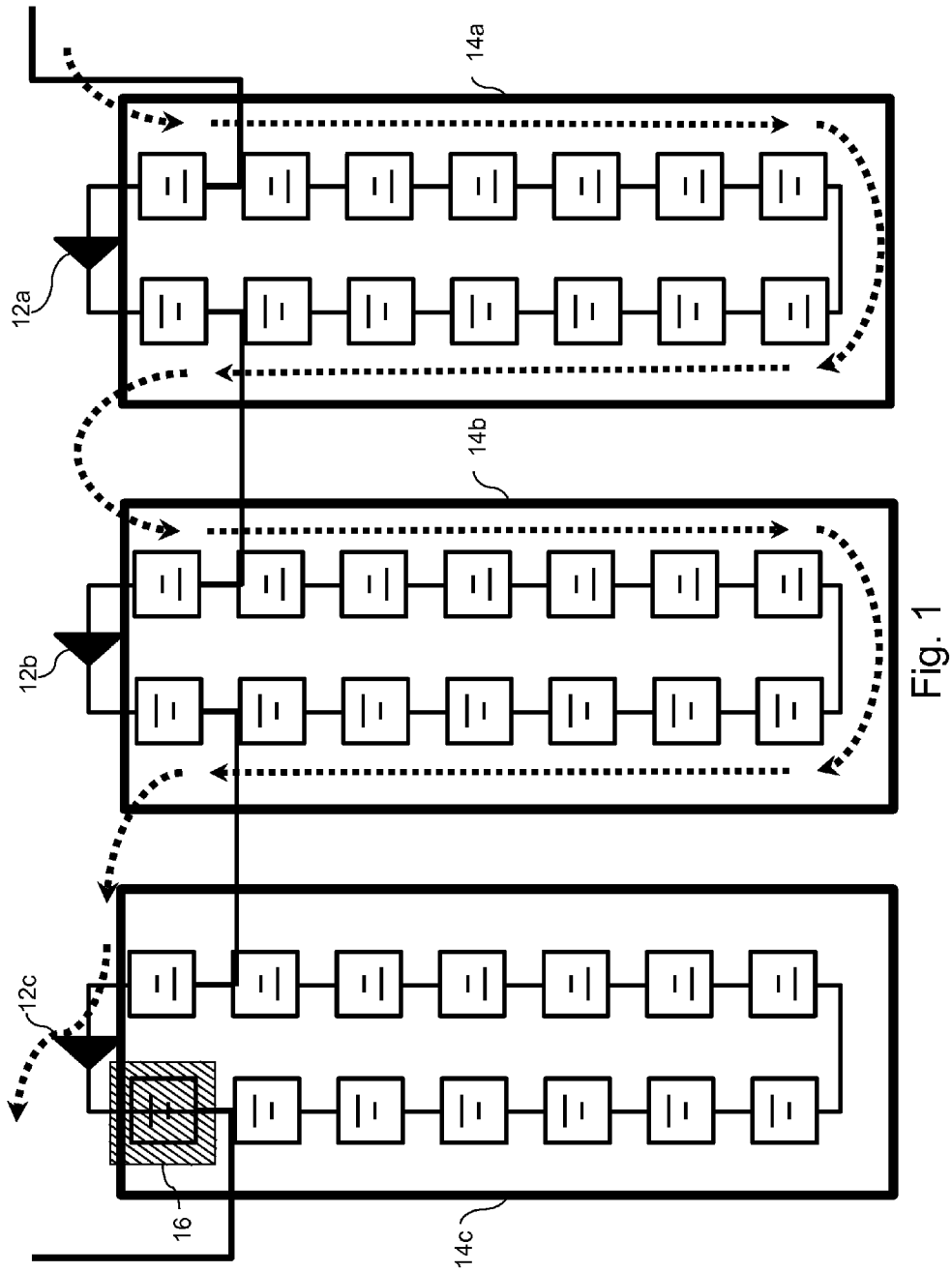
FIG. 1 is a high level box illustration of a previous art solar panel.
Figure 2:
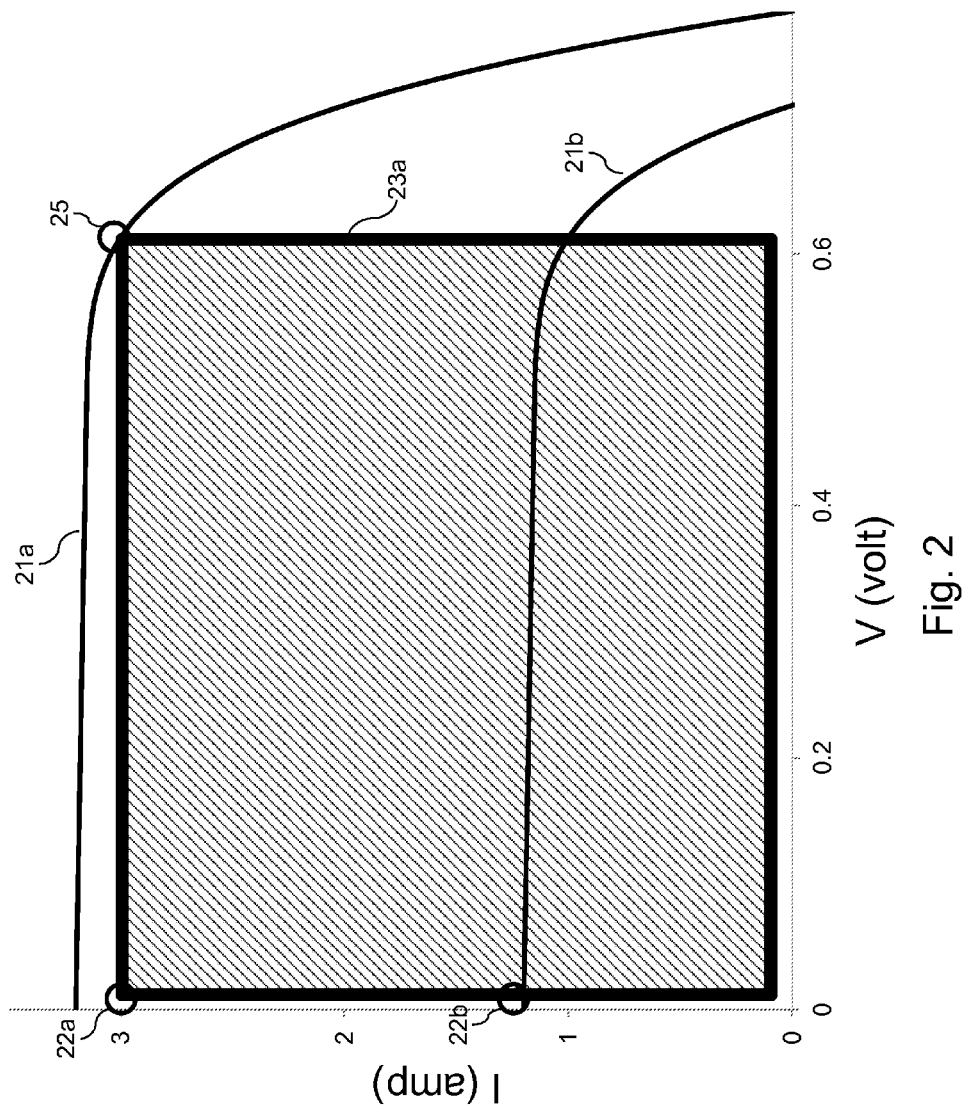
FIG. 2 depicts a normal forward operating mode of an IV-characteristic of a fully irradiated and a shaded solar cell.
Figure 3:
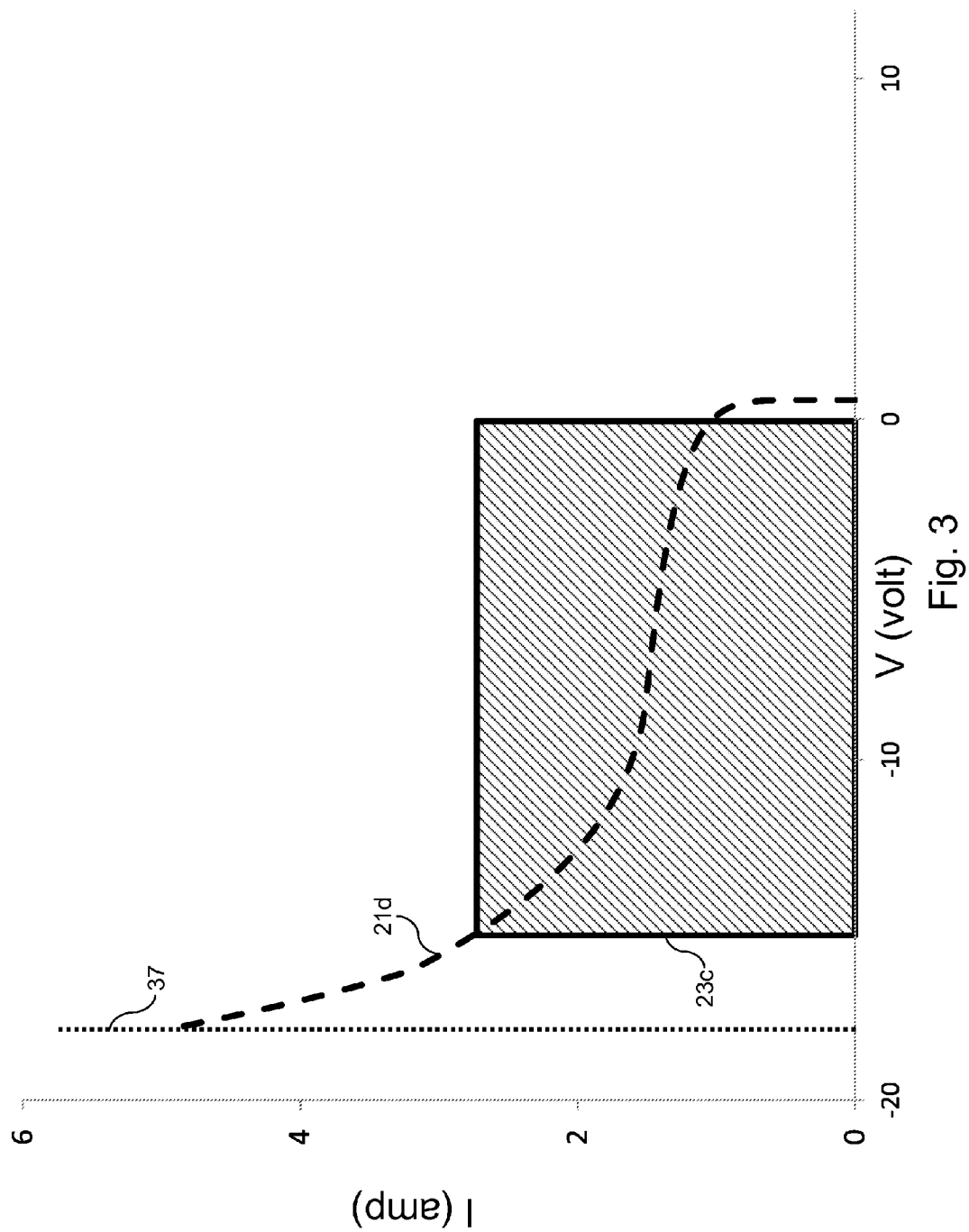
FIG. 3 depicts the normal forward operating modes of an IV-characteristic of a partially shaded substring and of a fully irradiated portion thereof and a full IV-characteristic of a shaded cell.
Figure 4:
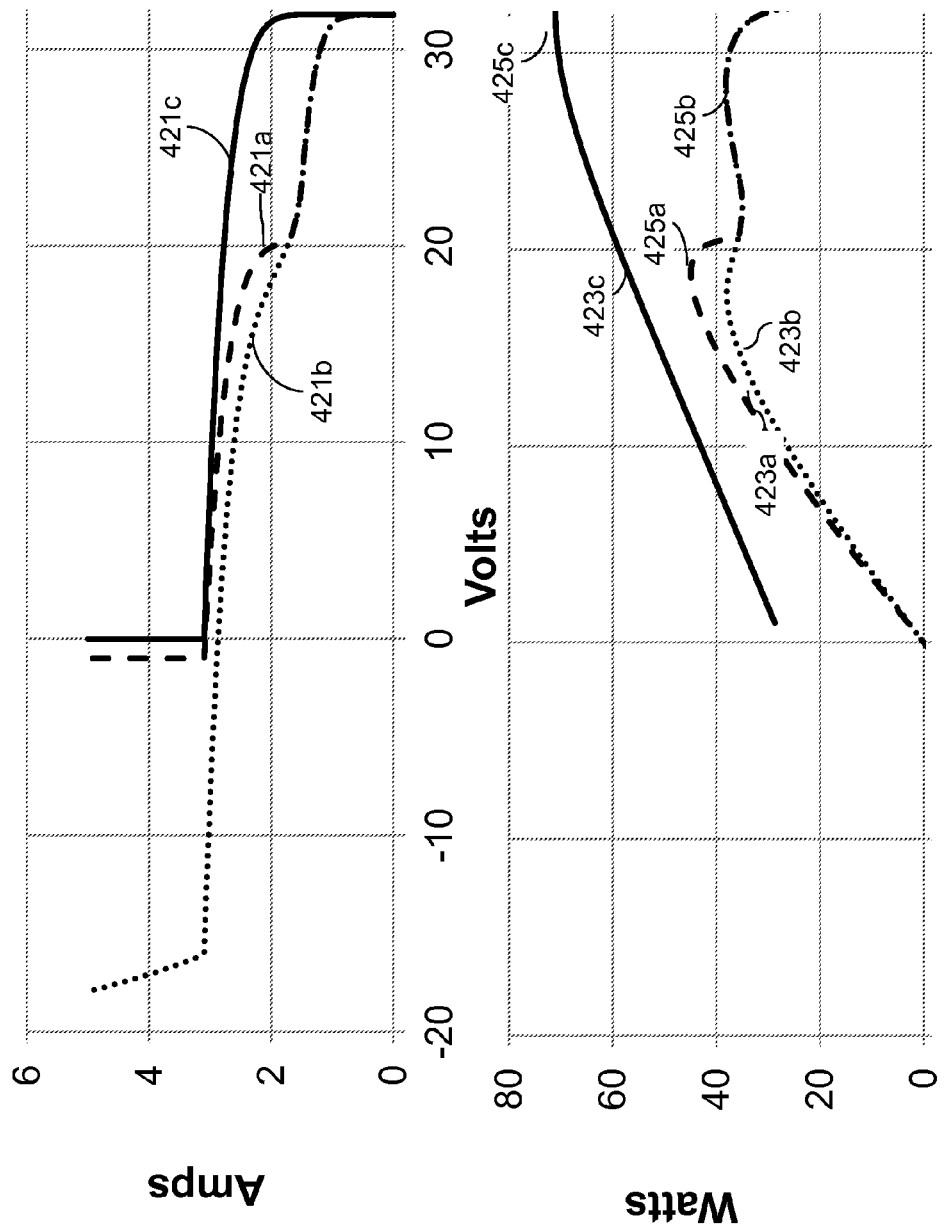
FIG. 4 depicts IV-characteristics and power curves of a partially shaded and a fully irradiated solar panels.

In the example of FIG. 3, the breakdown threshold voltage of −18V occurs at 5 Amp current and the breakdown power threshold is 18V×5 Amp=80 Watt. To avoid burn out, a substring will have a maximal length less than the minimal length necessary to reach the threshold power of 80 Watt/(0.6V/cell×3 Amp)=44 cells. Not all substrings in a solar panel need to have the same length. The main point is that the length of any substring is too small to produce a break down threshold power.

More particularly in the example of FIG. 5, the maximum length of any one substring is eighteen cells. The maximal output produced by a substring under terrestrial solar radiation conditions is about 18 cells×0.6 V/cell×3 Amp=32 Watt which is less than the break down threshold of a photovoltaic cell (the power required to produce reverse bias break down of a shaded cell). Therefore, panel 510 does not require any protective mechanism to avoid burnout of shaded cells. Particularly, there are no bypass diodes, and MPP controllers 570a-c have no special provision to cut off large currents. Thus, the solar panel system of FIG. 5 does not lose power due to dissipation in bypass diodes and does not require complex connections and programming of diodes and uses simple MPP controllers 570a-c.

Circuitry Overview

Figure 6:
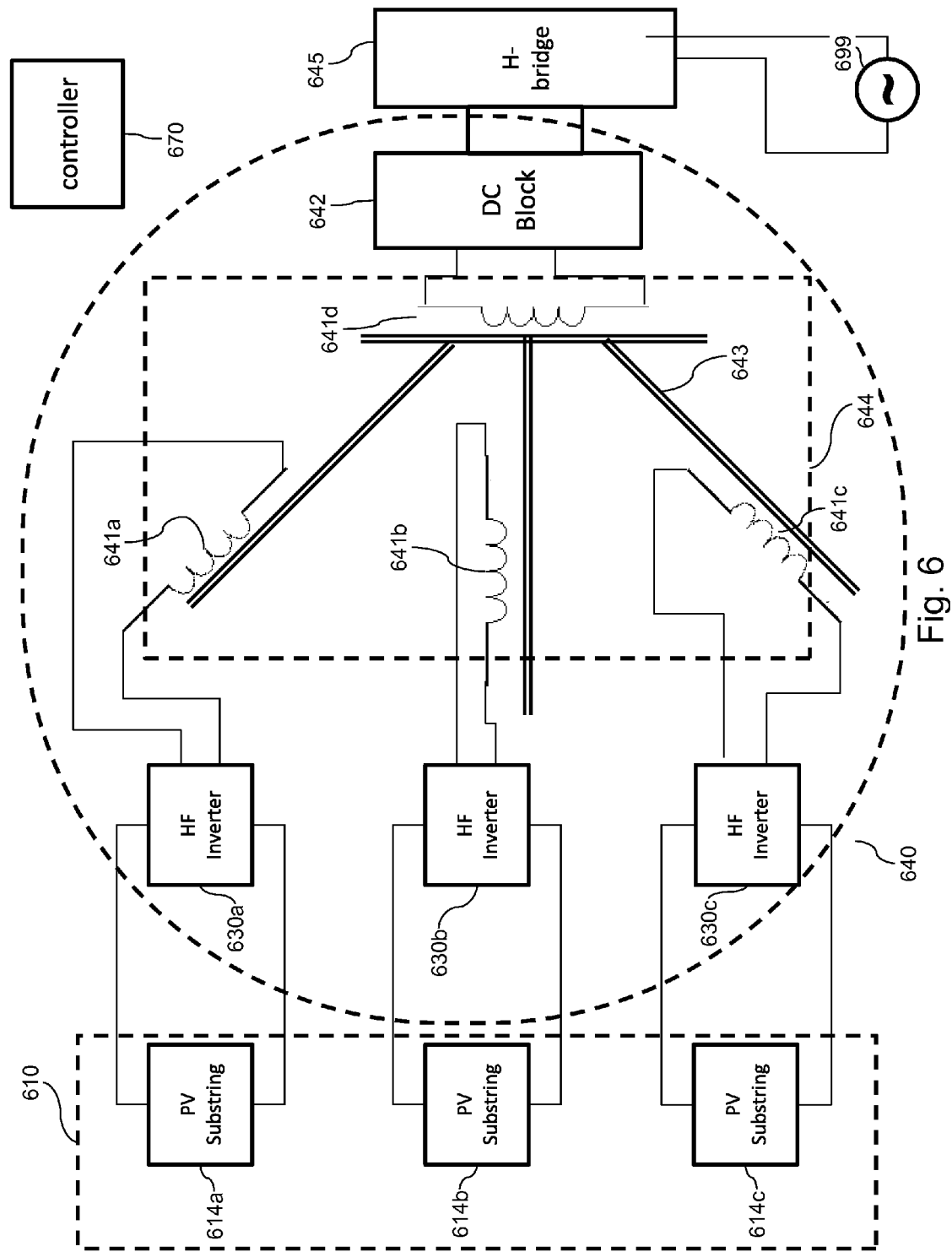
FIG. 6 is a high level box illustration of a second embodiment of a solar panel system have independent short substrings and power collectors and a combiner transformer without bypass diodes.

FIG. 6 is an illustrative block diagram of an example of a solar collector system with a combiner circuit 640 which is a DC maximizer for a solar panel 610 with three independent substrings 614a, 614b and 614c. Each substring 614a-c is independently connected to a corresponding independent collector circuit, high frequency (HF)-inverters 630a, 630b and 630c and a corresponding primary winding 641a, 641b and 641c of a combiner transformer 644. Combiner transformer 644 includes a core 643 which connects primary windings 641a-c to secondary windings 641d. Secondary windings 641d output electrical power via DC block 642 and H-bridge 645 to a power grid 699. The entire system is controlled by a controller module 670.

In the example of FIG. 6, bypass diodes are unnecessary because each of the PV substring 614a-c is independently connected to a corresponding primary winding 641a-c and HF-inverter 630a-c. Synchronization by pulse width modulation (PWM) is performed independently for each substring 614a-c minimizing power losses due to solar irradiation variations and shade. Independent PWM adjustment of output voltage and current of each HF-inverter 630a-c allows dynamic balancing and combining of the output of HF-inverters 630a-c without regard to the voltage and current in sub-strings 614a-c and even when the system performance changes over time due to changes in illumination or aging of parts.

In the example of FIG. 6 combiner transformer 644 has the following characteristics: three primary windings Vin=9V, Iin=1.1 A and one secondary winding Vout=462V Iout=64 mA, Frequency=100 KHz.

High Frequency (HF)-Inverter Circuitry

Figure 7:
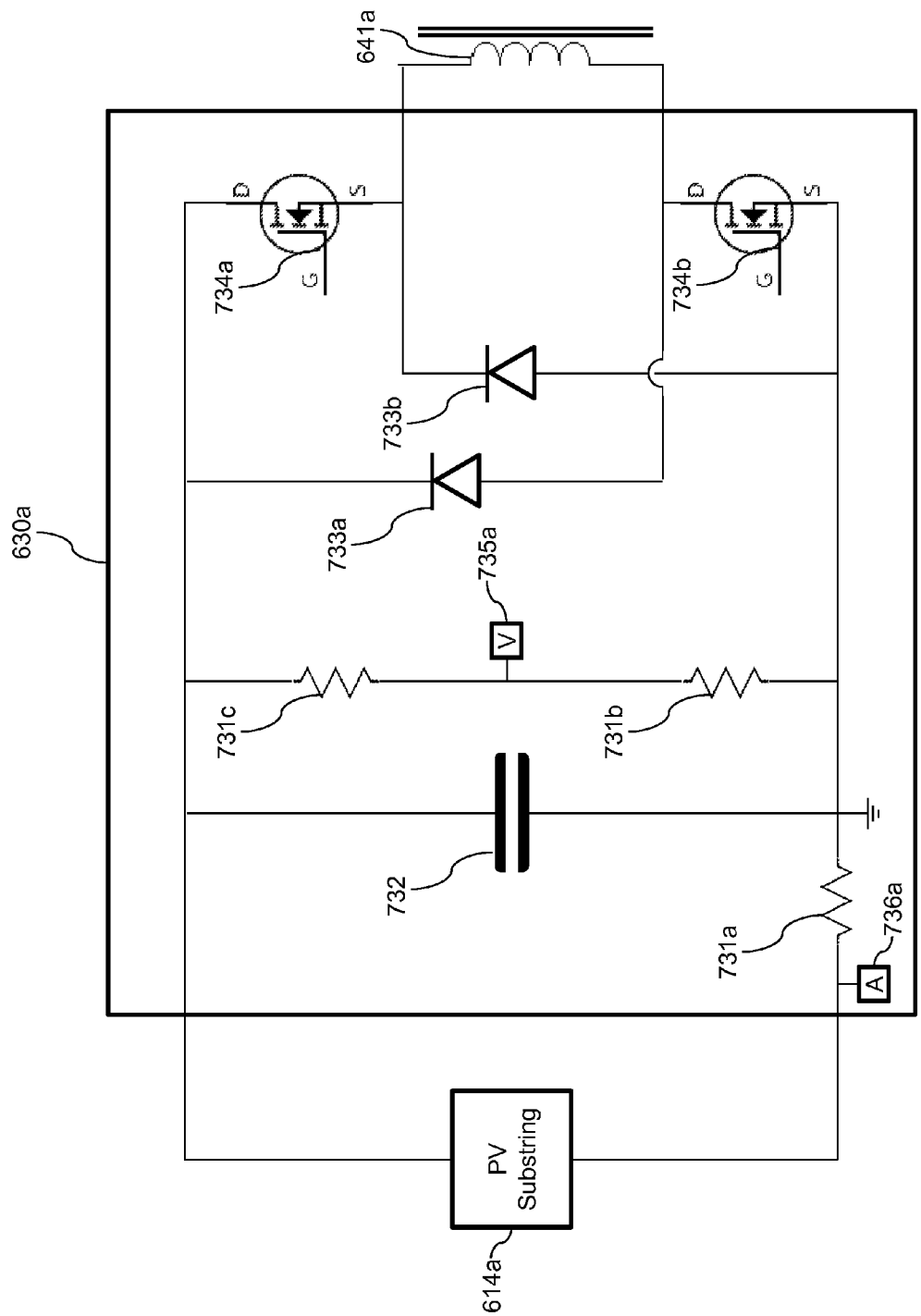
FIG. 7 is a diagram of an embodiment of an HF-inverter.
Figure 9:
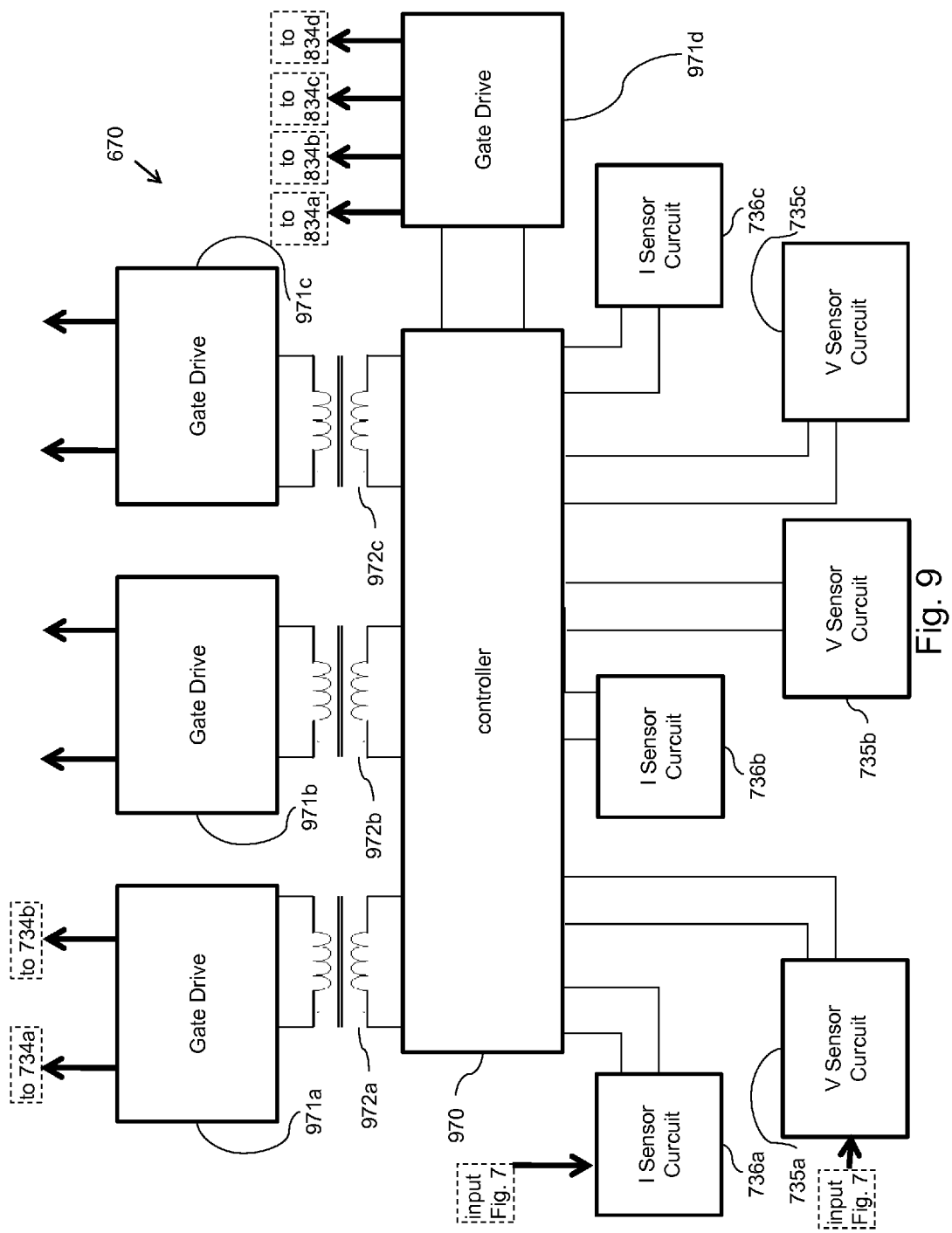
FIG. 9 is a diagram of an embodiment of a controller.

FIG. 7 is a block diagram illustrating details of HF-inverter 630a. HF-Inverter 630a is a two-switch HF-inverter. The switches, power MOSFETS 734a and 734b, are both controlled by the gate drive signal (FIG. 9). Power MOSFETS 734a,b conduct during one subinterval of the control signal and switched off during a second subinterval. The transformer magnetizing current forward-biases diodes 733a and 733b. Primary winding 641a is then connected to PV substring 614a with a polarity opposite to that of first subinterval. The magnetized current then decreases. When the magnetized current reaches zero, diodes 733a and 733b are reverse-biased. The magnetized current then remains at zero for the balance of the switching period. Capacitor 732 helps stabilize the signal.

Voltage is measured by a simple voltage divider circuitry comprised of resisters 731b and 731c providing a scaled down voltage to the voltage sensor circuit 735a. The current is measured through a shunt resistor 731a by a current sensor circuit 736a. One non-limiting example of the components of the system of FIG. 7 is provided in Table 1.

TABLE 1 a non-limiting example of the components in FIG. 7

| Part | Description | Performance | Source | Model |
|---|---|---|---|---|
| 614a | PV substring | 30 W | Solarex | MSX-30 Lite |
| 731a | Resistor | 0.1326 Ω ½ W | Vishay | 0.1326 Ω ½ W |
| 731b | Resistor | 2995 Ω ½ W | Vishay | 2995 Ω ½ W |
| 731c | Resistor | 1 MΩ ½ W | Vishay | 1 MΩ ½ W |
| 732 | Capacitor | 4700 μF, 100 V | Vishay | 4700 μF, 100 V |
| 733a, b | Fast Recovery Rectifier | 4 A, 100 V | M.C.C. | MUR4100 |
| 734a, b | Power MOSFET | 14 A, 500 V, 0.4 Ω | Fairchild | IFRP 450 |

DC Block and H-Bridge Circuitry

Figure 8:
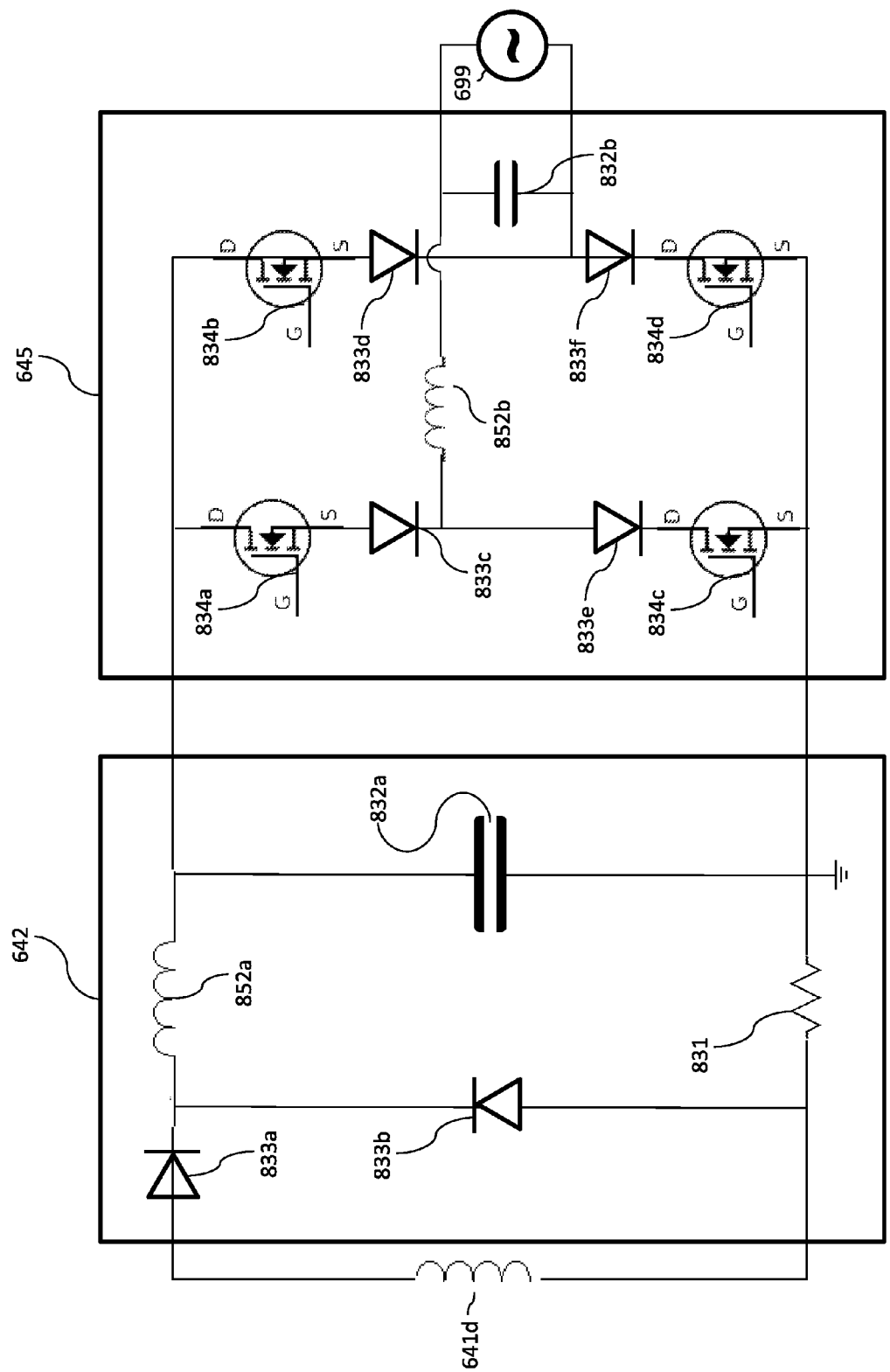
FIG. 8 is a diagram of an embodiment of a DC-block and H-bridge.

FIG. 8 is an illustration of an embodiment of DC block 642 and H-bridge 645. Diodes 833a and 833b along with capacitor 832a, inductor 852a and resistor 831 serve as two way rectifier to rectify high frequency AC output from HF-inverter 630a to a DC input to the H-bridge. Diode 833a conducts during the first subinterval and diode 833b conducts during the second subinterval.

The H-bridge operates as a polarities switch and converts the rectified DC Voltage to an AC grid voltage. The switching frequency is 20 KHz to 40 KHz and the generated envelope is identical to the grid frequency and synchronized with the power grid 699. Power MOSFETS 834a, 834b, 834c and 834d are used as switches. Connection to grid 699 is made through inductance-capacitance filter including inductor 852b and capacitor 832b the grid frequency is 50 Hz and the grid voltage is 220V. Diodes 833c, 833d, 833e and 833f act to stabilize the cycle.

Controller module 670 controls switching of HF-inverters 630a-c, independent MPP current optimization (via pulse width modulation PWM) for each substring 614a-c, time synchronization of independent MPP's, detecting the working current and voltage, controlling the of H-bridge 645 and synchronization with power grid 699, islanding detection, built in test (BIT) and communication with other systems.

TABLE 3 a non-limiting example of the components in control module 670

| Part | Description | Performance | Source | Model |
|---|---|---|---|---|
| 933a, b | rectifier diode | small signal diode | Fairchild | LL4148 |
| 970 | DSP Microprocessor | 26 MIPS Fixed-Point DSP Core. Single Cycle Instruction Execution (38.5 ns) | Analog Device | ADMC331 |
| 971a-d | Optical isolated gate drive | F = 25 KHz, Isolation 2,500 V | Toshiba & Texas Instrument | TLP250 and SN74LS06 |
| 972a-c | Signal transformer | f = 20 KHz, L in = 25 mH n1:n2 = 1:10, Iin = 40 mA, Vin = 4 V, Vout = 4 V, Iout = 40 mA Rin = 100 Ω | | Piton |
| 735a-c | Voltage Sensor Circuits | Shaping signal for the signal transformer | | Known to skilled in art |
| 736a-c | Current Sensor circuits | Shaping signal for the signal transformer | | Known to skilled in art |

TABLE 2 a non-limiting example of the components in FIG. 8

| Part | Description | Performance | Source | Model |
|---|---|---|---|---|
| 831 | Resistor | 0.25 Ω ½ W | Vishay | 0.25 Ω ½ W |
| 832a | Capacitor | 1 µF, 450 V | Vishay | 1 µF, 450 V |
| 832b | Capacitor | 3 µF, 600 V | Vishay | 3 µF, 600 V |
| 833a, b | Fast Recovery Rectifier | 4 A, 100 V | M.C.C. | MUR4100 |
| 833c-f | Fast Recovery Rectifier | 8 A 800 V | International Rectifiers | 6FL80S05 |
| 834a-d | Power MOSFET | 14 A, 500 V, 0.4 Ω | Fairchild | IFRP450 |
| 852a | Inductor | 10 mH, 1 A, 600 V | Vishay | 10 mH, 1 A, 600 V |
| 852b | Inductor | 5mHy, 1 A, 600 V | Vishay | 5mHy, 1 A, 600 V |

Controller Circuitry

FIG. 9 is a simplified block diagram illustrating an embodiment of controller module 670 which sends control signals and receives feedback from the solar generation system. The heart of controller module 670 is a microprocessor 970 which performs calculations and makes decisions. Control signals are sent from microprocessor 970 via signal transformer 972a to gate drive 971a in order to control Power MOSFETS 734a,b of HF-inverter 630a. Similarly, signals are sent via signal transformers 972b and 972c to gate drives 971b and 971c to control Power MOSFETS of HF-inverters 630b and 630c. Control of Power MOSFETS 834a-d is via gate drive 971d.

Signals to track voltage and current measurements in substring 614a and HF-inverter 630a from voltage sensor circuit 735a and current sensor circuit 736a are relayed to processor 970 via respective signal transformers, diodes and leveller circuits (not shown). Similarly voltage and current in substrings 614b,c and HF-inverters 630b,c are monitored using voltage sensor circuits 735b,c and current sensor circuits 736b,c.

Figure 10:
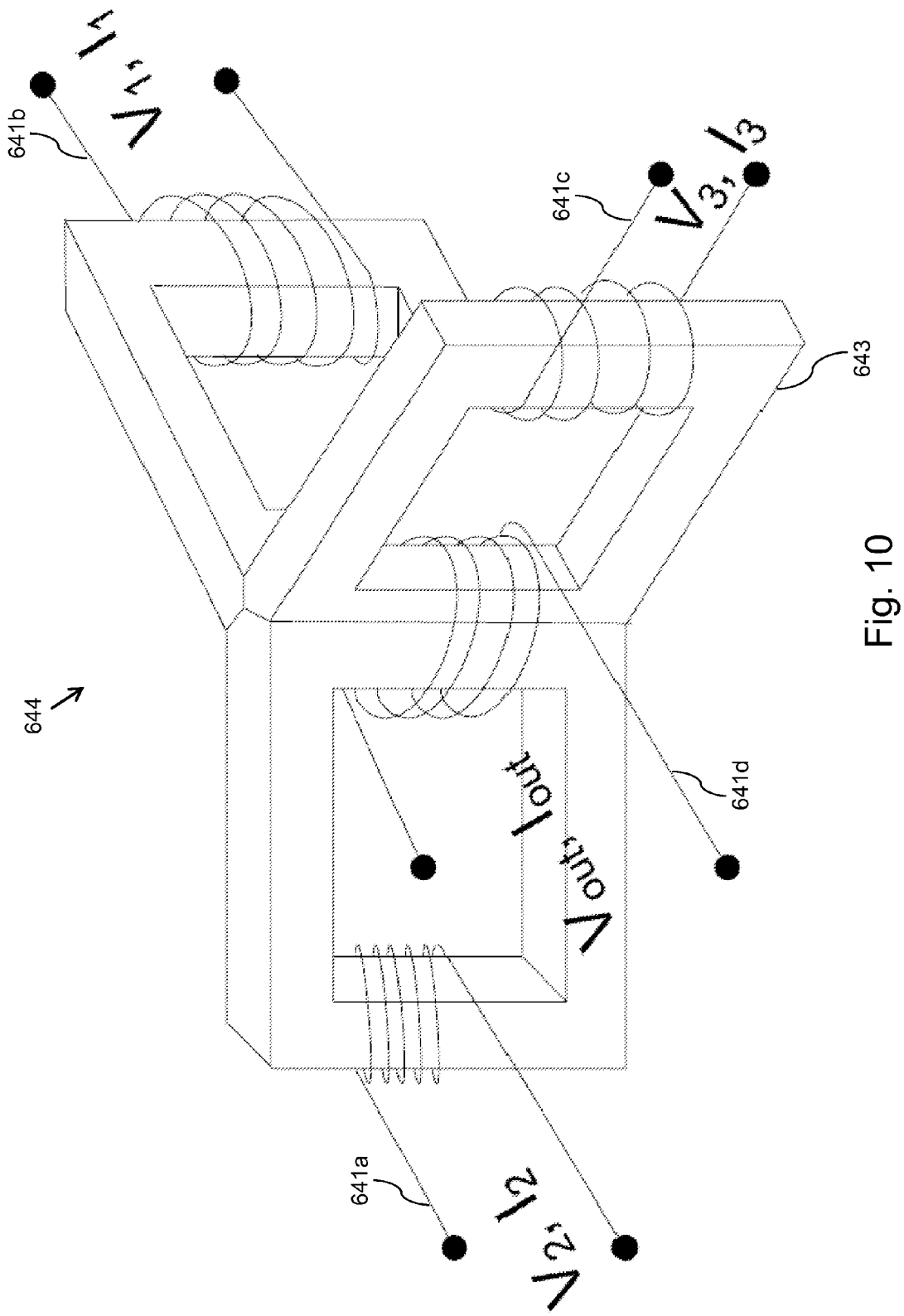
FIG. 10 schematically illustrates a perspective view of a combiner transformer.

FIG. 10 is a schematic illustration of a perspective view of combiner transformer 644.

Method of Manufacture

Figure 11:
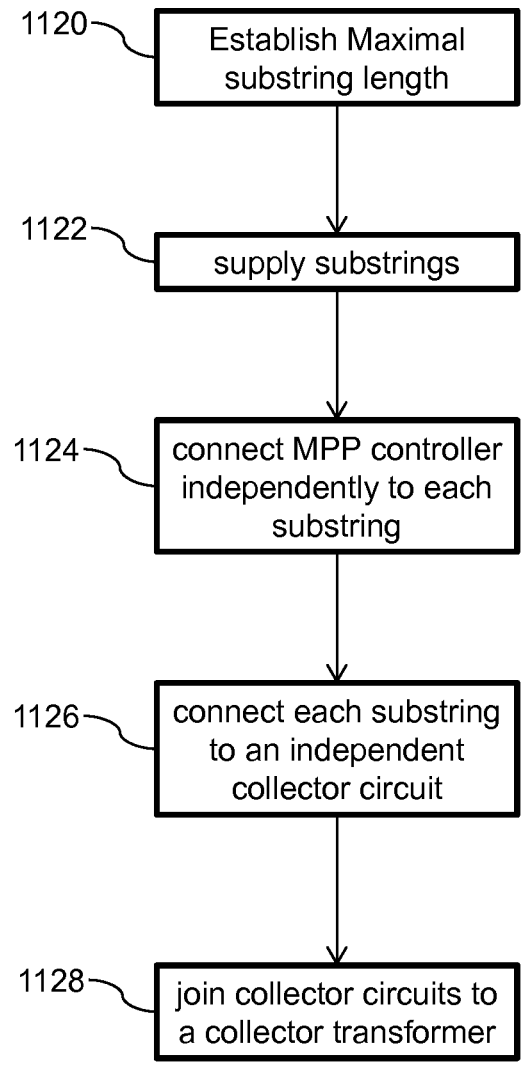
FIG. 11 is a flow chart illustrating a method of manufacturing a solar power generation system.

FIG. 11 is a flow chart illustrating a method of manufacturing a solar power generation system. The first step is establishing 1120 a maximum length of a substring. In the example of FIGS. 6 and 11, panel 610 uses cells that produce 0.6V at 3 Amp and are safe from reverse bias burn out under reverse bias of up to 40 Watt. In order to avoid burn out, the maximal length of a substring is chosen to be smaller than the minimal length necessary to reach the threshold power of 40 Watt. The minimal length of a substring to reach the threshold is 40 Watt/(0.6V/cell×3 Amp)=22 cells.

Once the maximal length of a substring is established 1120, a few substrings 614a-c (in the example of FIGS. 6 and 10, three substrings 614a-c) are supplied 1122, and installed into panel 610. Different substrings in a solar panel may have different lengths or use different types and sizes of cells as long as each independent substring is too short to produce more than forty Watts of power.

Each substring 614a-c is connected 1124 independently to controller 670 so that the MPP of each substring 614a-c can be determined independently of other substrings 614a-c. To avoid reverse bias burn out of cells, each substring 614a-c is connected 1126 to an independent collector circuit (HF-inverters 630a-c). The circuits are independent in that each PV cell is exposed to the power of at most one of substring 614a-c, and will not reach the reverse bias burn out threshold. Thus, the voltage and current in each substring 614a-c can be measured and controlled separately from other substrings 614a-c. Therefore, each substring 614a-c can function at its optimal MPP without burning out shaded cells, regardless of the conditions of the other substrings 614a-c. This helps maximize power output of panel 610 under partially shaded conditions. The output channels of the independent collector circuits are then joined 1128 to combiner transformer 644.

Method of Generating Electricity

Figure 12:
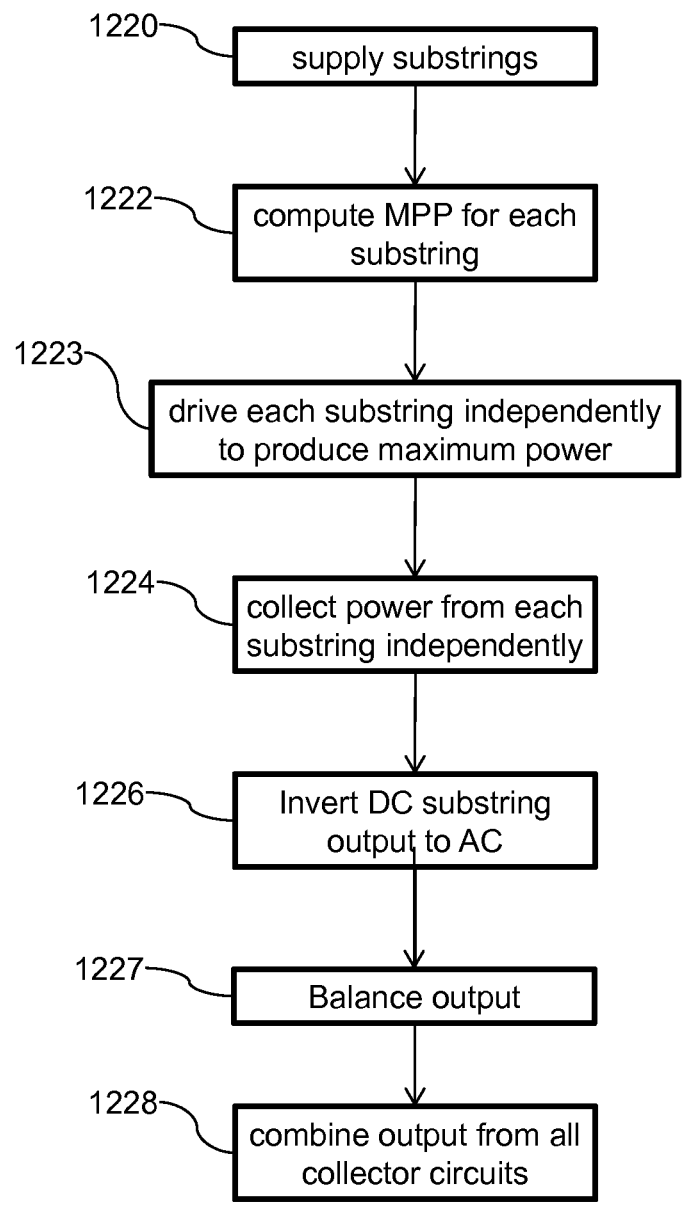
FIG. 12 is a flow chart illustrating a method of generating electricity from solar energy.

FIG. 12 is a flow chart illustrating a method of generating electricity from solar energy. Substrings 614a-c of solar cells are supplied 1220 as part of solar panel 610. Panel 610 is placed in sunlight and the current for maximum power output of each substring 614a-c is computed 1222 and each substring 614a-c is driven 1223 independently at the optimum current to produce the maximum power output.

Power from each substring 614a-c is collected 1224 independently and inverted 1226 to an AC signal by HF-inverters 630a-c. The output current, frequency and voltage of HF-inverters 630a-c are synchronized and balanced 1227 using PWM. It is emphasized that unlike previous art solar generators where synchronization depends on balancing of hardware components, the PWM synchronization of HF-inverters 630a-c is dynamic. By adjusting the timing of power mosfets 734a,b, controller 670 can adjust the voltage and current output of HF-inverters 630a-c independently of the current and voltage of substrings 614a-c. Therefore the power of substrings 614a-c can be combined efficiently even when there are changes in the balance of solar energy over the system or when various parts of the system age. The output of HF-inverters 630a-c is combined 1228 in combiner transformer 644 and sold to a power company.

Application to Large Solar Fields

Figure 13:
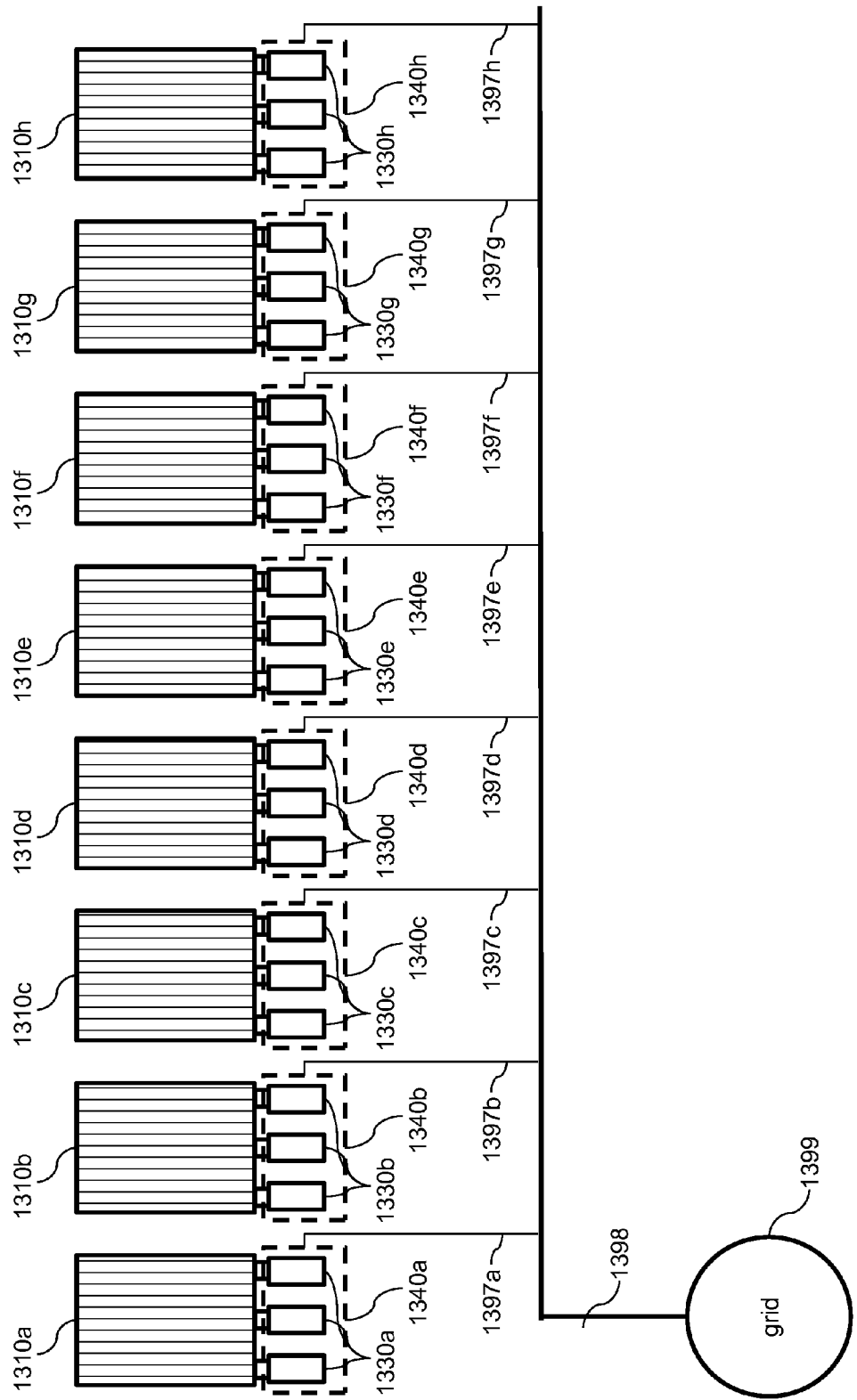
FIG. 13 is a schematic illustration of a system for generating electricity from solar energy.

FIG. 13 is a schematic illustration of a solar power collection field. The field includes eight solar panels 1310a, 1310b, 1310c, 1310d, 1310e, 1310f, 1310g and 1310h. Each panel 1310a-h is contains three substrings, and power from each substring is collected by a separate collector circuit. Thus, each panel 1310a-h is connected to a corresponding set of three collector circuits 1330a, 1330b, 1330c, 1330d, 1330e, 1330f, 1330g and 1330h. Power from each set of collector circuits is combined by a corresponding combiner circuit 1340a, 1340b, 1340c, 1340d, 1340e, 1340f, 1340g and 1340h. Each combiner 1340a-h is joined by a corresponding wire 1397a, 1397b, 1397c, 1397d, 1397e, 1397f, 1397g and 1397h to a trunk line 1398. Energy in trunk line 1398 is transferred to a power grid 1399. Power input and output to and from combiners 1340a-h can be adjusted by PWM so that even if one of panels 1310a-h ages and ceases to perform optimally, the power output remains balanced with other panels 1310a-h. Also the output of combiners 1340a-h can be chosen between high and low current or voltage and between alternating or direct current to allow the most efficient collection and transport of power across the field to grid 1399.

Figure 14A:
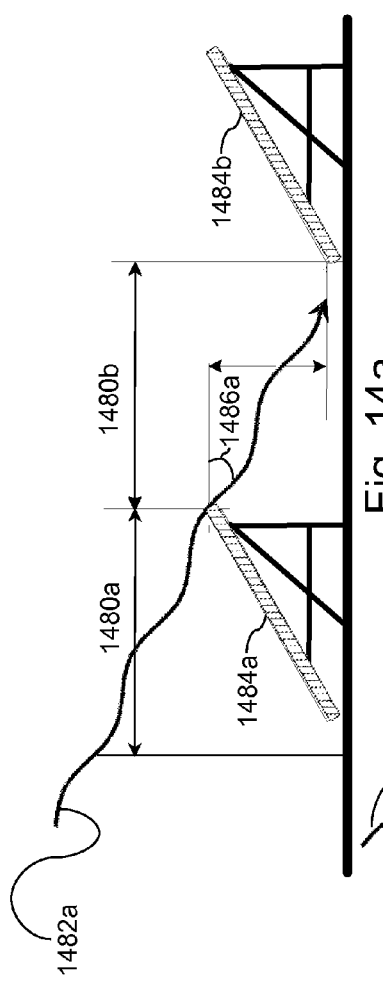
FIG. 14 is a schematic illustration of a row spacing in a system for generating electricity form solar energy.

As explained above and illustrated in FIG. 14a, in previous industrial installations with DC panel output and central inverters, the distance 1480b between the panels rows is kept at least as large as the row width distance 1480a, so that under low angle 1486a solar radiation 1482a one row 1484a will not shade the other row 1484b. Otherwise partial shading would activate the bypass diode are protecting the panels and nullifying morning and evening power production.

Figure 14B:
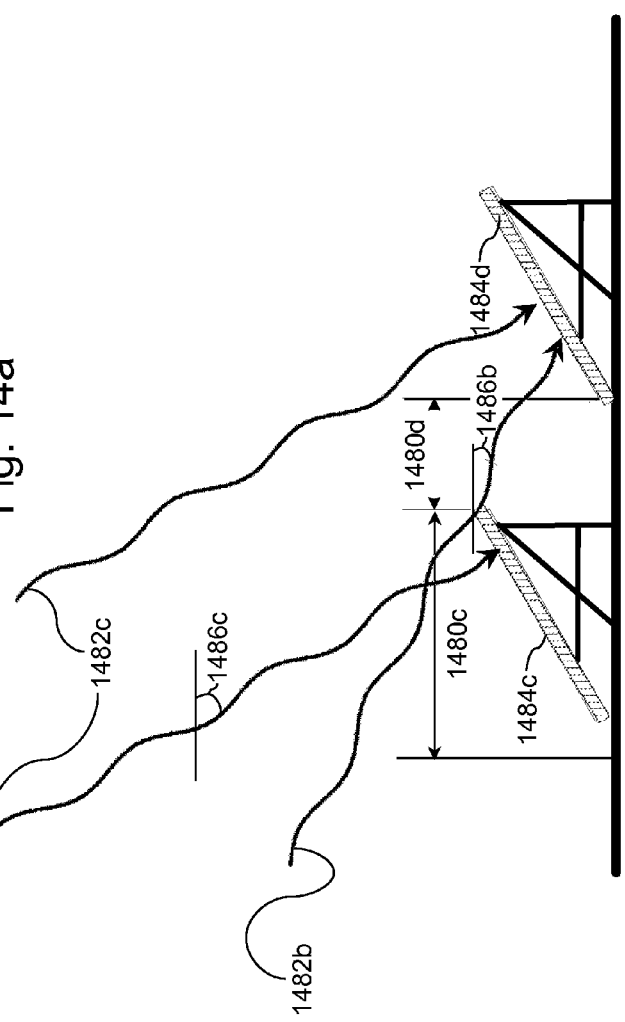

As illustrated in FIG. 14b Using micro-inverter on each substring and independent substring MPP control (as described herein above), a panel can produce power even under partial shading of one substring. Therefore, rows of panels are located more closely (the distance 1480d between the panel rows is less than the row width distance 1480c). Although one row 1484c will shade another row 1484d under low angle 1486a solar radiation 1482a, nevertheless, the partial shading will not have a great effect on power output. On the other hand, in the middle of the day when solar radiation 1482c is at a high angle 1486c the closer spaced rows 1484c,d will produce more power per unit field area.

Figure 15:
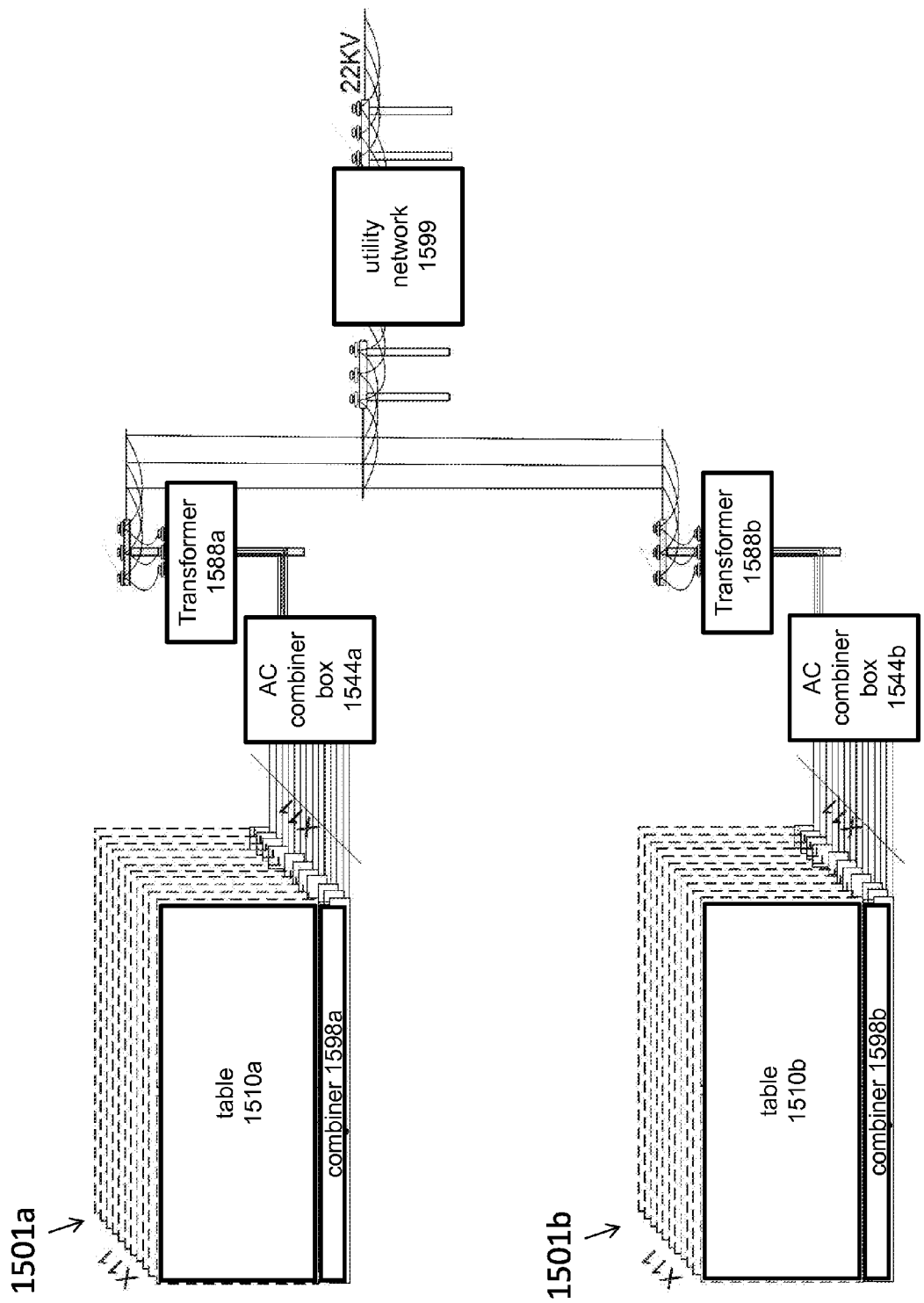
FIG. 15 is a schematic illustration of a system for generating electricity from solar energy.

FIG. 15 illustrates a 1 MW solar power field employing photovoltaic micro-inverters. The field includes two modules 1501a and 1501b. Each module containing eleven tables. Pictured are the front two tables 1510a and 1510b. Each Table 1510a,b is 80 m long by 5 m and mounted at an angle of 20 degrees facing upward and Southward. Mounted on each table are forty columns of solar panels. Each column contains five panels and each panel is two meters wide by one meter. Each panel has three substrings and each substring outputs 80 W in full sun. An AC combiner (similar to that pictured in FIG. 6) is mounted on the back of each panel (not shown) and accessible from the back of the table. As explained above (in FIG. 6 and the accompanying explanation), each substring is controlled independently to run at a string MPP. The output of each string is adjusted by PWM to 550V AC and the three substrings of each panel. The AC signal in the example of FIG. 15 is 550V at 50 Hz. Thus, in full sun the power output of each panel is about 240 W and the current output from a single panel is approximately one half Amp. Standard 1.5 mm diameter electrical cable (of 1 m length for the bottom panel to 5 m length for the top panel) connects power output from each panel to combiner 1598a and 1598b and a trunk line at the bottom of the table. The electrical connections are standard parallel AC connectors as are used in residential housing and do not require specialized installation. Eleven combiner 1598a trunk lines each carrying 550V and a maximum 200 Amp connect the eleven combiners 1598a of the eleven tables 1510a of the first module 1501a to a first AC combiner box 1544a and transformer 1588a and eleven combiner 1598b trunk lines each carrying 550V and a maximum 200 Amp connect the eleven combiners 1598b of the eleven tables 1510b of second module 1501b to a second AC combiner box 1544b and transformer 1588b. Trunk lines use 6 mm electrical cable.

The output of transformer 1588b is 22 KV and is carried by standard overhead high Voltage power lines to the distribution system 1599.

The voltage and synchronization of each panel of the power generation system of FIG. 15 is controlled by a MPP controller using PWM and can be adjusted. Thus, the connections do not have to be fine tuned and as parts age or come under differential sun, the controller dynamically adjusts each panel output to produce a maximum power and combine properly with output of the other panels.

The invention claimed is:
1. A system for generating electricity comprising:
a plurality of substrings mounted on one or more photovoltaic panels, each of said panels including at least two of said plurality of substrings, each substring of said plurality of substrings including a respective number of photovoltaic cells, wherein each said respective number of photovoltaic cells is less than a number of said photovoltaic cells necessary to produce a break down threshold power output large enough to produce a reverse bias burn out of a cell of said plurality of photovoltaic cells under terrestrial solar radiation;
a plurality of independent collector circuits; each substring of said plurality of substrings connected to a separate respective independent collector circuit of said plurality of independent collector circuits, said each substring outputting a direct current power to said respective collector circuit and said collector circuit outputting a high frequency alternating current power output and a single combiner circuit connected to said plurality of independent collector circuits; said combiner circuit combining said high frequency power output from said plurality of independent collector circuits and outputting a combined lower frequency grid power output.

2. The system of claim 1, wherein each of said plurality of independent collector circuits inverts a respective direct current output from a corresponding substring of said plurality of substrings into an high frequency alternating current of a frequency of at least 20 kHz.

3. The system of claim 1, wherein said single combiner circuit is hardwired to said plurality of independent collector circuits.

4. The system of claim 1, further comprising:
a second combiner circuit, and
a trunk line configured for joining an output of said single combiner circuit with an output of said second combiner circuit.

5. The system of claim 1, wherein at least one substring of said plurality of substrings-does not include a bypass diode connected across the substring.

6. The system of claim 1, further comprising:
a single controller configured for computing a respective independent maximum power point for said each said substring of said plurality of substrings.

7. A method for manufacturing a solar power system comprising:
supplying one or more photovoltaic panels, each of said panels including a plurality of substrings each substring of said plurality of substrings including a respective number of photovoltaic cells, said respective number less than a number of said photovoltaic cells necessary to produce a break down threshold power output large enough to produce a reverse bias burn out of a cell of said plurality of photovoltaic cells under terrestrial solar radiation;
connecting a separate respective high frequency inverter of a plurality of high frequency inverters to each said substring of said plurality of substrings;
joining outputs of said plurality of high frequency inverters to a single lower frequency grid power inverter, and
outputting a combined lower frequency grid power output from said lower frequency grid power inverter.

8. The method of claim 7, further comprising:
joining an output of said single lower frequency grid power inverter with an output of a second grid power inverter.

9. The method of claim 7, wherein said joining includes hard wiring each said high frequency inverter to a separate respective primary winding of a combiner transformer.

10. A method for generating electricity from solar energy comprising:
supplying one or more photovoltaic panels, each of said panels including a plurality of substrings, each substring of said plurality of substrings including a respective number of photovoltaic cells, said respective number less than a number of said photovoltaic cells necessary to produce a break down threshold power large enough to produce a reverse bias burn out of a cell of said plurality of photovoltaic cells under terrestrial solar radiation, and
inverting a respective DC power output from each said substring of said plurality of substrings to a respective high frequency power output with a separate respective independent collector circuit of a plurality of collector circuits;
combining said respective high frequency power outputs of said plurality of collector circuits to a combined lower frequency grid power output in a single combiner circuit.

11. The method of claim 10, further comprising:
computing a maximum power point for at least one of said plurality of substrings.

12. The method of claim 10, further comprising:
computing a respective maximum power point for each substring of said plurality of substrings and wherein each said respective maximum power point is independent of any other respective maximum power point.

13. The method of claim 10, further comprising:
joining an output of said single combiner circuit with an output of a second combiner circuit.

14. The method of claim 13, further comprising:
balancing an output of said first combiner circuit and an output of a second combiner circuit by pulse width modulation.

15. The system of claim 6, wherein said single controller further includes a separate respective control circuit controlling each said collector circuit of said plurality of collector circuits.

16. The system of claim 15, wherein said first control circuit includes a respective gate drive operationally connected to a power MOSFET of each of said plurality of collector circuits.

17. The system of claim 1, wherein said plurality of substrings and said plurality of independent collector circuits are all mounted on a single photovoltaic panel.

18. The system of claim 1, wherein each said respective independent collector circuits inverts a respective direct current output from a corresponding substring of said plurality of substrings into a high frequency alternating current of a frequency of at between 20-40 kHz.

19. The method of manufacture of claim 7, further comprising:
connecting a single maximum power point controller to each inverter of said plurality of high frequency inverters.

20. The method of claim 11, further including generating electricity with said at least one substring at said maximum power point when a first part of said first at least one substring is shaded and a second part of said first at least one substring is fully illuminated.

21. The method of claim 10, wherein said inverting of at least one said respective DC power output is to said first high frequency power output of frequency of at between 20-40 kHz.

22. The method of claim 10, wherein said inverting of each said respective DC power output is to said first high frequency power output of frequency of at least 20 kHz.

23. The method of claim 12, further including generating electricity with at least one substring of said plurality of substrings is at a respective maximum power point when a first part of said at least one substring is shaded and a second part of said at least one substring is fully illuminated and generating electricity with another substring of said plurality of substrings is at said second respective maximum power point for an fully irradiated substring.

24. The system of claim 1, wherein each of said panels includes between two to five substrings of said plurality of substrings.

25. The system of claim 1, where said respective number of photovoltaic cells in each said substring is between 10 to 20.

26. The system of claim 1, wherein said respective number of photovoltaic cells in each said substring is less than 44.

* * * * *